(12) United States Patent
Kitamura

(10) Patent No.: US 8,477,819 B2
(45) Date of Patent: Jul. 2, 2013

(54) SEMICONDUCTOR LASER DIODE DEVICE AND METHOD OF FABRICATION THEREOF

(75) Inventor: Shotaro Kitamura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 173 days.

(21) Appl. No.: 12/951,820

(22) Filed: Nov. 22, 2010

(65) Prior Publication Data

US 2011/0134955 A1 Jun. 9, 2011

(30) Foreign Application Priority Data

Dec. 3, 2009 (JP) ................................. 2009-275260

(51) Int. Cl.
*H01S 5/00* (2006.01)

(52) U.S. Cl.
USPC .......................... 372/50.11; 372/96; 372/102

(58) Field of Classification Search
USPC ........................................ 372/50.11, 96, 102
See application file for complete search history.

(56) References Cited

U.S. PATENT DOCUMENTS

| | | | |
|---|---|---|---|
| 4,796,273 A | 1/1989 | Yamaguchi | |
| 5,349,598 A * | 9/1994 | Ouchi et al. | 372/50.21 |
| 5,648,978 A * | 7/1997 | Sakata | 372/50.11 |
| 6,577,660 B1 | 6/2003 | Muroya | |
| 2004/0042516 A1 | 3/2004 | Takaki et al. | |
| 2007/0263694 A1* | 11/2007 | Fujii | 372/102 |

FOREIGN PATENT DOCUMENTS

| | | |
|---|---|---|
| JP | 61-216383 A | 9/1986 |
| JP | 63-111689 A | 5/1988 |
| JP | 64-48487 A | 2/1989 |
| JP | 1-194380 A | 8/1989 |
| JP | 3-110885 A | 5/1991 |
| JP | 5-145194 A | 8/1993 |
| JP | 2001-36192 A | 2/2001 |
| JP | 2004-128372 A | 4/2004 |
| JP | 2008-66620 A | 3/2008 |

* cited by examiner

*Primary Examiner* — Yuanda Zhang
(74) *Attorney, Agent, or Firm* — Foley & Lardner LLP

(57) ABSTRACT

Disclosed is a distributed feedback semiconductor laser diode device capable of operating at a high output ratio of forward/backward optical power while ensuring satisfactory stability of single-mode oscillation. The distributed feedback semiconductor laser diode device is configured to include a diffraction grating formed in an optical waveguide thereof. In a partial region of the optical waveguide, there is formed an alternately repetitive pattern of a grating part possessing a distributive refractivity characteristic and a no-grating space part possessing a uniform refractivity characteristic. The no-grating space part possessing a uniform refractivity characteristic has an optical path length that is half an integral multiple of a wavelength of laser oscillation, and the grating part possessing a distributive refractivity characteristic includes at least five grating periods.

9 Claims, 12 Drawing Sheets

SEMICONDUCTOR LASER DIODE DEVICE AND METHOD OF FABRICATION THEREOF

CROSS-REFERENCE TO RELATED APPLICATIONS

The disclosure of Japanese Patent Application No. 2009-275260 filed on Dec. 3, 2009 including the specification, drawings and abstract is incorporated herein by reference in its entirety.

BACKGROUND OF THE INVENTION

The present invention relates to semiconductor laser diode devices, and more particularly to a semiconductor laser diode device suitable for use as a light source in optical fiber communication and a method of fabrication thereof.

There are two structural types of distributed feedback semiconductor laser diode (DFB-LD) devices; anti-reflection/anti-reflection (AR/AR) coated type, and anti-reflection/high-reflection (AR/HR) coated type. An AR/AR DFB-LD device is configured to have both front and rear facets thereof coated for anti-reflection as shown in FIG. 10, and an AR/HR DFB-LD device is configured to have a front facet thereof coated for anti-reflection and a rear facet thereof coated for high reflection as shown in FIG. 11.

FIG. 10 is a configuration diagram of a typical conventional AR/AR DFB-LD device, schematically illustrating a longitudinal cross-section parallel to the optical waveguide axial direction thereof. FIG. 11 is a configuration diagram of a typical conventional AR/HR DFB-LD device, schematically illustrating a longitudinal cross-section parallel to the optical waveguide axial direction thereof. As shown in FIGS. 10 and 11, each DFB-LD device has an optical waveguide including a grating structure (diffraction grating structure) in which a periodic grating 1 is provided. In the grating structure, a period of the grating 1 is set to be "$\lambda/2$" ($\lambda$: indicates a wavelength in the optical waveguide). In most cases, a phase shift part 4 having an optical path length of $\lambda/4$ is disposed at a predetermined position in the grating structure. Thus, single-wavelength laser oscillation is performed. The term "optical path length" as used herein denotes a value of "(Refractive index of optical waveguide)×Distance".

The AR/AR DFB LD device is favorable in that the fabrication yield regarding single-mode wavelength oscillation is relatively high. Contrastingly, the AR/HR DFB-LD device is favorable in that the forward/backward optical output ratio (=ratio of forward optical power to backward optical power) is relatively high to provide a superior level of forward optical output. While the AR/AR DFB-LD device has a forward/backward optical output ratio of approximately 1.5 at the maximum, the AR/HR DFB-LD device has a forward/backward optical output ratio of 4 or higher. For example, in Patent Document 1 indicated below, there is disclosed an AR/HR DFB-LD arrangement wherein a resonator length L is 600 µm, and two $\lambda/4$ phase shift parts are disposed at positions of 440 µm and 500 µm from the rear facet position respectively to provide "$\kappa L=3$" so that an output of optical power from the front facet will be eight times higher than optical power at the rear facet. In Patent Document 2 indicated below, there is disclosed an AR/HR DFB-LD arrangement wherein a $\lambda/4$ phase shift part is disposed at a position where the intensities of leftward and rightward reflected radiations are equal to each other.

However, it is known that, in practical fabrication of AR/HR DFB-LD devices, defects of poor single-mode oscillation are encountered at a rejection rate of approximately 30% due to adverse effects of improper phasing in a grating 1 caused by high reflection at the rear facet position.

As shown in FIGS. 10 and 11, in the formation of a grating 1 for a DFB-LD device, a periodic structure patterned over an InP substrate 2 is buried with an InGaAsP guide layer 3. An optical coupling coefficient $\kappa$, which is expressed by the following equation (1), is used as an index representing the degree of periodic variation in refractive index in an optical waveguide corresponding to the grating 1, i.e., the degree of longitudinal mode fixation of waveguided light with respect to periodic variation in refractive index. Thus, the optical coupling coefficient $\kappa$ denotes an intensity level of mutual action of a DFB-LD grating structure and a light beam.

$$\kappa = (n1-n2)\pi/\lambda 0 \qquad (1)$$

In the equation (1),

"$\lambda 0$" indicates a wavelength of laser oscillation light in a vacuum,

"n1" indicates an equivalent refractive index at a grating valley in the optical waveguide concerned, and "n2" indicates an equivalent refractive index at a grating peak in the optical waveguide concerned.

In cases where DFB-LD devices are produced through ordinary fabrication processes, the entire optical waveguide of each DFB-LD device has a uniform value of optical coupling coefficient $\kappa$.

In contrast, significantly advantageous effects can be attained by providing different optical coupling coefficient values $\kappa$ in different regions of an optical waveguide.

For example, if a configuration having a relatively large value of optical coupling coefficient $\kappa$ only in a device rear region of an optical waveguide is formed and applied to AR/AR DFB-LD design, it becomes possible to produce an AR/AR DFB-LD device capable of providing a forward/backward optical output ratio as high as that of an AR/HR DFB-LD device while ensuring satisfactory stability of single-mode oscillation that is characteristic of AR/AR DFB-LD design. In Patent Document 3 indicated below, there is disclosed an AR/HR DFB-LD configuration in which a relatively large value of optical coupling coefficient $\kappa$ is provided in a device rear region by using a different etched grating pattern (depth) therein. Patent Document 4 indicated below discloses a configuration in which a value of optical coupling coefficient $\kappa$ varies gradually from a device front position to a device rear position (different heights of grating are provided), along with the description of a method of fabrication thereof. Patent Document 5 indicated below discloses a configuration in which a guide layer is provided with a buried grating structure, a partial composition of a rear region of the guide layer being arranged to be different from the composition of a front region of the guide layer (the rear region has a composition for a wavelength longer than that in the front region), and the depth of a grating structure part buried with the guide layer in the front region being arranged to be different from that in the rear region. The disclosure of a method for fabricating the above configuration is also included in the Patent Document 5.

Further, as another example for attaining advantageous effects by providing different optical coupling coefficient values $\kappa$ in different optical waveguide regions, it has been proposed to form a configuration in which a value of optical coupling coefficient $\kappa$ in the vicinity of a $\lambda/4$ phase shift part is smaller than that in the other regions.

Generally, at the time of laser oscillation in a DFB-LD device, the level of optical density becomes higher in the vicinity of a $\lambda/4$ phase shift part. This is one of the causes of occurrence of wavelength chirping in modulation drive. The phenomenon "wavelength chirping" is an undesirable condition of wavelength variations on the order of Δv to several GHz, which brings about an adverse effect on optical signal communication such as a decrease in transmission limit distance. Hence, it is desirable to reduce the degree of wavelength chirping wherever possible.

It is already well known that the concentration of optical density in the vicinity of a λ/4 phase shift part can be alleviated by providing a smaller value of optical coupling coefficient κ in the vicinity of λ/4 phase shift part than that in the other regions. Thus, the degree of wavelength chirping can be reduced advantageously. For example, in Patent Document 6, there is disclosed a technique wherein the degree of wavelength variations in pulse modulation can be minimized without impairing the stability of single-longitudinal-mode oscillation under the conditions that the value of reflectivity at each of both front and rear facets is relatively small "=0.3%", the value of κL (L: resonator length) is in a range of "0.8<κL<3.0" except a position in the vicinity of 1.3, and the value of phase shift Δθ in a discontinuous phase part at the center area of a resonator is in a range of "nπ+0.5π<Δθ<nπ+0.75π (λ/4<Δθ<3λ/8)".

In Patent Document 9 indicated below, there is disclosed a DFB-LD device wherein a plurality of grating parts having mutually different pitches are disposed along the axial direction of an active layer.

The degree of freedom in DFB-LD design can be increased advantageously by using a technique for providing different optical coupling coefficient values κ in different optical waveguide regions as mentioned above.

RELATED ART REFERENCES

Patent Documents

Patent Document 1:
Japanese Unexamined Patent Publication No. Hei 5 (1993)-145194 (Paragraph Nos. 0017 to 0019, claim 1, FIG. 1(a))
Patent Document 2:
Japanese Unexamined Patent Publication No. Shou 61 (1986)-216383
Patent Document 3:
Japanese Unexamined Patent Publication No. Hei 3 (1991)-110885 (FIG. 1(c), Line 4 in upper right column, p. 2 to Line 16 in lower left column, p. 2)
Patent Document 4:
Japanese Unexamined Patent Publication No. 2001-36192 (FIG. 8, Paragraph Nos. 0029, 0030)
Patent Document 5:
Japanese Unexamined Patent Publication No. 2008-66620 (FIG. 1)
Patent Document 6:
Japanese Unexamined Patent Publication No. Hei 1 (1989)-194380 (p. 2)
Patent Documents 7:
Japanese Unexamined Patent Publication No. 2004-128372 (FIG. 2)
Patent Document 8:
Japanese Unexamined Patent Publication No. Shou 63 (1988)-111689
Patent Document 9:
Japanese Unexamined Patent Publication No. Shou 64 (1989)-48487

SUMMARY OF THE INVENTION

The techniques of the related art are examined below.

As can be seen from the above, it is possible to attain significant advantages by providing different optical coupling coefficient values κ in different optical waveguide regions in a DFB-LD device.

For this purpose, it has been proposed to form a configuration wherein different grating depths are provided in different optical waveguide regions (refer to the Patent Document 4 cited above, for example). However, for the formation of this configuration, difficult-to-control processes are employed, e.g., an etching process for grating formation is performed on the basis of the dependency of an etching rate on the area of a photoresist pattern.

Further, it is rather difficult to provide different grating depths as intended to produce a sufficient degree of difference in terms of optical coupling coefficient κ. For example, in implementation of an AR/AR DFB-LD design arrangement wherein a relatively high value of optical coupling coefficient κ is provided in a device rear region of an optical waveguide for increasing a forward/backward optical output ratio, it is required to produce a degree of difference of approximately three times in grating depth between the device front and rear regions concerned. This requirement is considerably difficult to meet in practical fabrication processing.

Hence, in the Patent Document 5 cited above, it is proposed to use a technique for composition modulation of an InGaAsP guide layer in addition to grating depth adjustment. However, it is also rather difficult to use this technique in practical fabrication processing because of stringent requirements for special process control of metal organic vapor phase epitaxy (MOVPE).

It is therefore an object of the present invention to provide a DFB-LD device that is arranged to have a predetermined distribution of optical coupling coefficient values κ along an optical waveguide thereof so as to perform lasing operation at a high output ratio of forward/backward optical power while ensuring satisfactory stability of single-mode oscillation, and also to provide a method for fabricating the DFB-LD device arranged as set forth above.

In addition, it is another object of the present invention to provide a DFB-LD device in which wavelength chirping is suppressed.

In accomplishing these objects of the present invention and according to one aspect thereof, there is provided a DFB-LD device including a diffraction grating formed in an optical waveguide thereof, the optical waveguide comprising: a plurality of grating parts each possessing a distributive refractivity characteristic; and a plurality of no-grating space parts each possessing a uniform refractivity characteristic; wherein an alternately repetitive pattern of the grating part possessing a distributive refractivity characteristic and the no-grating space part possessing a uniform refractivity characteristic is formed to provide a coarse grating lithographic region, wherein the grating part possessing a distributive refractivity characteristic includes at least a predetermined number of grating periods, and wherein the no-grating space part possessing a uniform refractivity characteristic has an optical path length that is half an integral multiple of a wavelength of laser oscillation.

Further, according to another aspect of the present invention, a phase shift part is disposed at a predetermined position in a region where the grating parts are formed in the optical waveguide.

Still further, according to another aspect of the present invention, there is provided a method for fabricating the DFB- LD device wherein a photoresist pattern for grating formation is drawn by electron beam lithography.

As described above, the present invention makes it possible to form an arrangement wherein optical coupling coefficient values κ are distributed predeterminedly along an optical waveguide. Hence, in accordance with the present invention, it is possible to adopt a configuration in which a relatively large value of optical coupling coefficient κ is provided in a device rear region of an optical waveguide, for example. Thus, there can be realized a DFB-LD device capable of operating at a high output ratio of forward/backward optical power while ensuring satisfactory stability of single-mode oscillation.

Further, the present invention makes it possible to form a configuration wherein a relatively small value of optical coupling coefficient κ is provided only in the vicinity of a λ/4 phase shift part. Thus, there can be realized a DFB-LD device in which wavelength chirping is suppressed.

BRIEF DESCRIPTION OF THE DRAWINGS

FIGS. 5A to 5D are cross-sectional views of fabrication flow processes according to the first preferred embodiment of the present invention, in which FIG. 5A shows a crystal growth process of a guide layer, a spacer layer, an active layer, and a clad layer, FIG. 5B shows a dry etching process, FIG. 5C shows a crystal growth process of a block layer, and FIG. 5D shows a crystal growth process of a clad layer and a contact layer;

DETAILED DESCRIPTION OF THE PREFERRED EMBODIMENTS

The present invention will now be described in detail by way of example with reference to the accompanying drawings. In a distributed feedback semiconductor laser diode (DFB-LD) device according to the present invention, an optical waveguide thereof is provided with a region having an alternately repetitive pattern of a grating part possessing a distributive refractivity characteristic and a no-grating space part possessing a uniform refractivity characteristic (coarse grating lithographic region). Each grating part having a distributive refractive characteristic includes at least five grating periods, and each no-grating space part having a uniform refractivity characteristic has an optical path length that is half an integral multiple of a laser oscillation wavelength. Another region of the optical waveguide has a continuous grating pattern without partial missing of grating lines (continuous grating lithographic region).

In the present invention, there may be provided an arrangement wherein a phase shift part (4) is included at a position in a region where the grating parts are formed in the optical waveguide.

Figure 7:
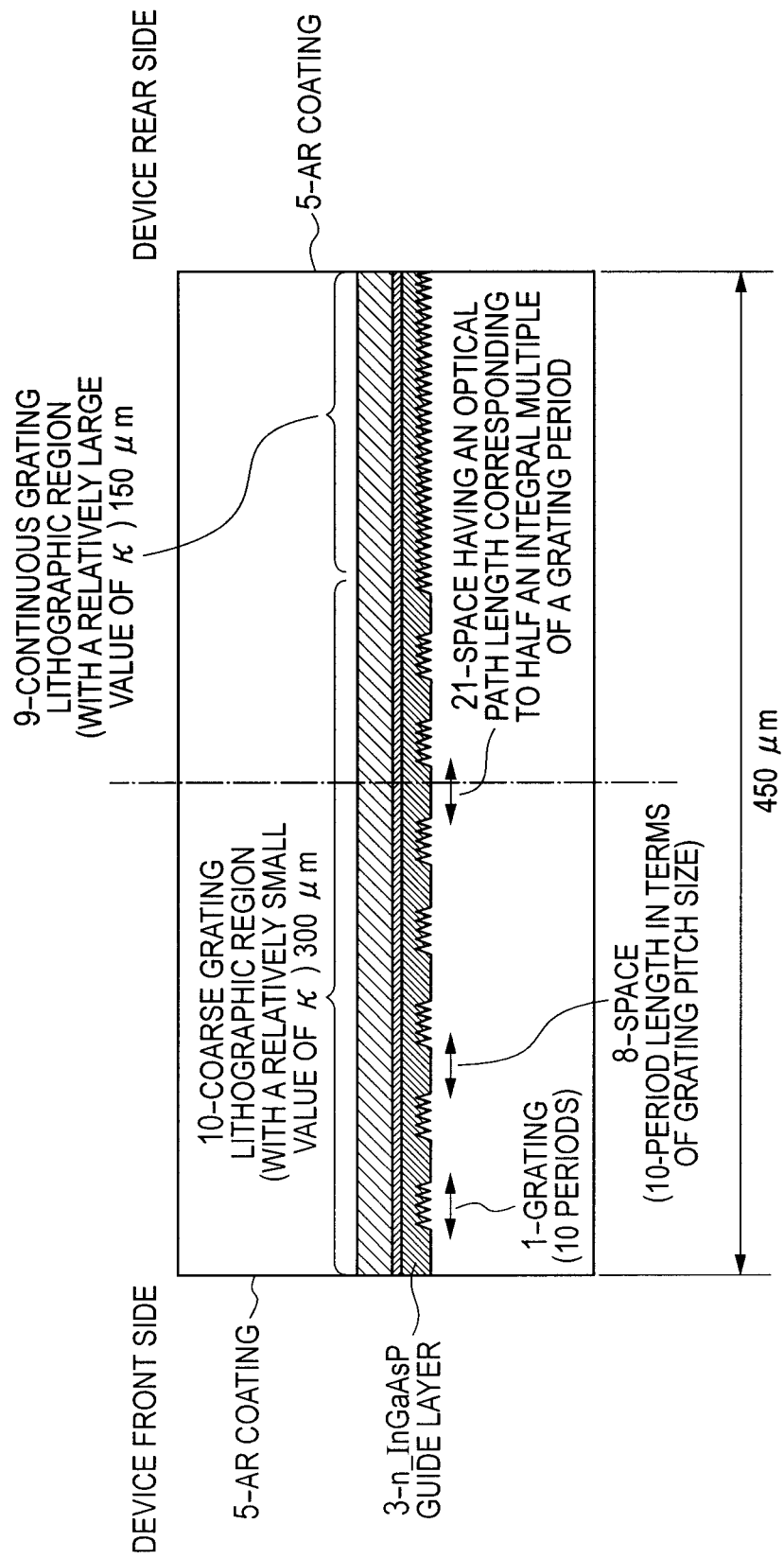
FIG. 7 is an explanatory diagram showing a configuration of a DFB-LD device according to a third preferred embodiment of the present invention (schematically illustrating a longitudinal cross-section parallel to the optical waveguide axial direction of the DFB-LD device)

Further, in the present invention, there may be provided an arrangement wherein one of the no-grating space parts possessing a uniform refractivity characteristic has an optical path length corresponding to half an integral multiple of a grating period of the grating part (indicated by reference numeral 21 in FIG. 7).

Still further, in the present invention, there may be provided an arrangement wherein a region having an alternately repetitive pattern of a grating part possessing a distributive refractivity characteristic and a no-grating space part possessing a uniform refractivity characteristic (coarse grating lithographic region) is disposed on the device front side of the optical waveguide.

Furthermore, in the present invention, there may be provided an arrangement wherein a region having an alternately repetitive pattern of a grating part possessing a distributive refractivity characteristic and a no-grating space part possessing a uniform refractivity characteristic (coarse grating lithographic region) is disposed in the vicinity of the phase shift part in the optical waveguide.

Moreover, in the present invention, instead of the phase shift part (4), there may be formed a region that possesses a uniform refractivity characteristic and has an optical path length corresponding to half an integral multiple of a grating period of the grating part.

The degree of freedom in DFB-LD design can be increased advantageously in cases where different optical coupling coefficient values κ are provided in different optical waveguide regions as required. In the present invention, coarse grating patterning and dense patterning for grating formation are performed to provide different optical coupling coefficient values κ in different optical waveguide regions. For this purpose, electron beam (EB) lithography is employed in a photoresist exposure process for grating formation.

In the present invention, a grating having periods each corresponding to ½ of an oscillation wavelength λ is formed in a predetermined region with partial missing of grating lines. That is, in an EB lithography process for drawing a grating photoresist pattern, a grating lithographic part and a no-grating space lithographic part are alternately repeated in a predetermined region. Thus, the level of grating density can be adjusted. The average value of optical coupling coefficient κ in a region having an adequate certain length is proportional to the level of grating density. Based on this condition, different optical coupling coefficient values κ can be provided in different optical waveguide regions.

As mentioned above, according to the present invention, it is possible to realize a DFB-LD device that is arranged to have a predetermined distribution of optical coupling coefficient values κ along an optical waveguide thereof so as to perform lasing operation at a high output ratio of forward/backward optical power while ensuring satisfactory stability of single-mode oscillation. In particular, the present invention is well suitable for application to the provision of a DFB-LD device that is used commonly for optical fiber communication wherein signal transmission over a distance longer than 25 km and modulation drive at a rate exceeding 1 Gbps are required, for example. Described below are the details of preferred embodiments of the present invention.

First Preferred Embodiment

Figure 1:
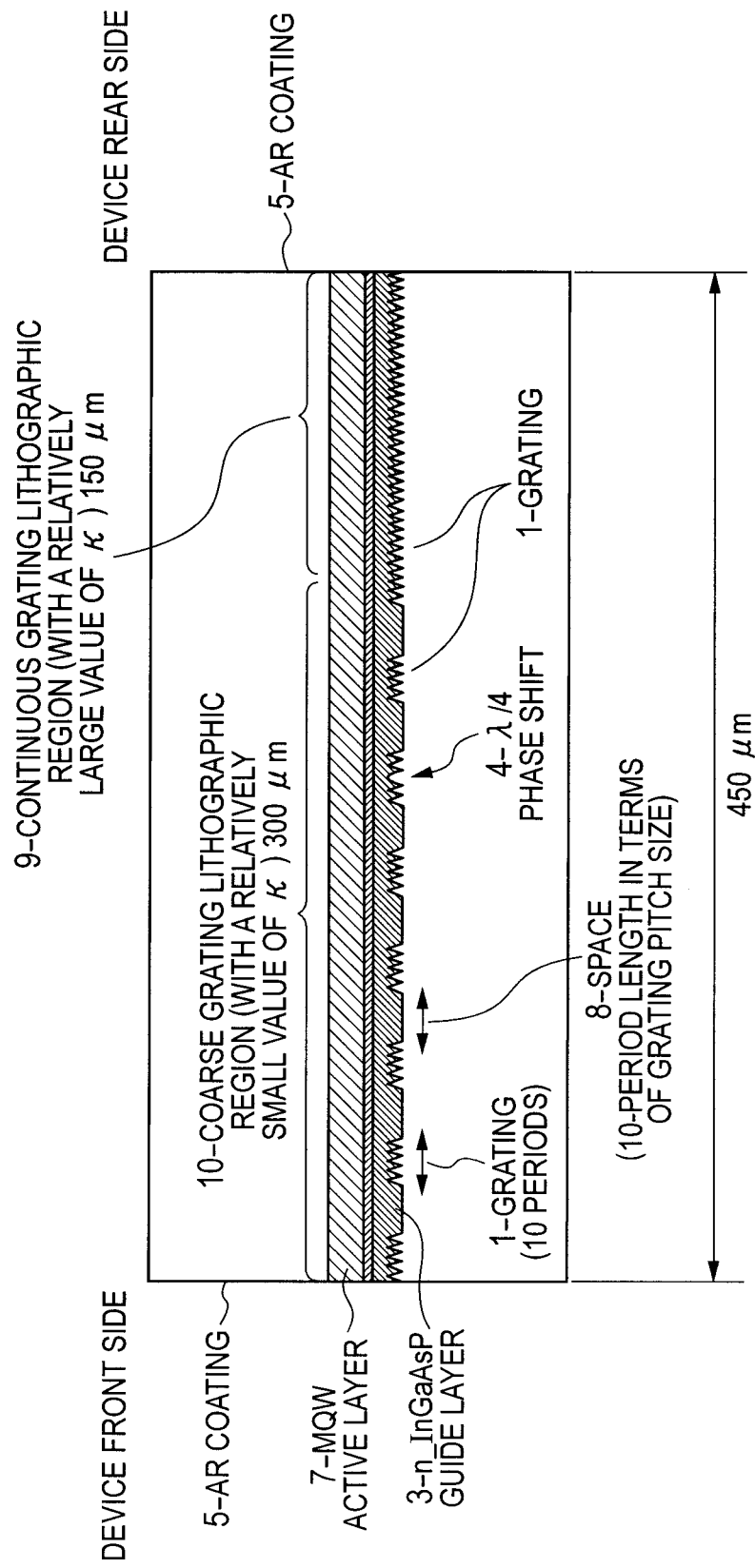
FIG. 1 is an explanatory diagram showing a configuration of a DFB-LD device according to a first preferred embodiment of the present invention (schematically illustrating a longitudinal cross-section parallel to the optical waveguide axial direction of the DFB-LD device)

Referring to FIG. 1, there is shown a configuration of a DFB-LD device according to a first preferred embodiment of the present invention. In FIG. 1, a longitudinal cross-section parallel to the optical waveguide axial direction of the DFB-LD device is illustrated schematically. In a device front region of an optical waveguide according to the first preferred embodiment of the present invention, a grating 1 is formed to have ten periods, followed by a no-grating space part having a length of ten-period space, and an alternately repetitive pattern of the grating 1 and no-grating space part is provided (coarse grating lithographic region 10). The no-grating space part, which is indicated as "Space" with reference numeral 8 in FIG. 1, has a uniform refractive index. As a device rear region, there is provided a continuous grating lithographic region 9 of an ordinary type (continuous grating periodic region without partial missing of grating lines).

The average density of coarse grating lithographic patterning in the device front region is ½ the density of continuous grating lithographic patterning in the device rear region, and the average value of optical coupling coefficient κ in the device front region is also ½ the value of optical coupling coefficient κ in the device rear region. In FIG. 1, the device front region thus conditioned is indicated as the coarse grating lithographic region 10.

A DFB-LD device featuring a relatively high value of optical coupling coefficient κ in a rear region thereof can be formed by providing a larger entire depth of grating than in the formation of a conventional DFB-LD device.

Both the front and rear facets of the device formed as mentioned above are coated for anti-reflection to provide AR/AR coating, thus making it possible to realize a DFB-LD arrangement having a high efficiency of forward optical output. It is to be noted, however, that the following two requirements should be met in implementation of the above technique.

The first requirement is that the optical path length of each no-grating space part, i.e., the optical path length of space part 8 should be accurately half an integral multiple of a wavelength of laser oscillation.

In strict terms, this optical path length of the space part 8 is not equal to an optical waveguide length corresponding to an integral multiple of a grating period of λ/2.

In a situation where a grating lithographic pattern is formed with partial missing of grating lines, there occurs a difference of approximately 0.05% in the refractive index of an optical waveguide corresponding to a part of partial missing of grating lines in most cases. Although this percentage seems to be insignificant, a value of approximately π in grating phase (approximately π/2 in λ phase) is provided in the case of summation over a range of device length "L=300 µm", for example, thereby causing an adverse effect on stability in single-mode oscillation.

In the Patent Document 7 and other related art literature, there is disclosed an exemplary arrangement wherein a grating lithographic pattern with partial missing of grating lines is formed for the purpose of adjusting a value of optical coupling coefficient κ (for adjusting an effective value of optical coupling coefficient κ by means of grating pattern thinning-out). However, in grating formation just with partial line missing (thinning-out), there arises a problem in that a high yield level regarding stable single-mode wavelength oscillation cannot be ensured.

In the first preferred embodiment of the present invention, "the optical path length of the space part 8 shown in FIG. 1=(optical waveguide length×refractive index)" is accurately adjusted to half an integral multiple of a wavelength λ in the optical waveguide.

That is, the space part 8 is provided so as to accurately meet the condition "(Integral multiple of grating periodic length of grating lithographic part)×Correction value of refractive index".

The correction value of refractive index indicated above is determined depending on the design of an individual optical waveguide and the conditioning of grating pattern etching process. In common applications, the correction value of refractive index is in the range of 0.9995 to 1.0005, which is adjusted just by using an EB lithography program.

Thus, except a λ/4 phase shift part 4, an optically continuous grating phase arrangement is provided entirely in the device.

The second requirement is that each grating lithographic part should not be too short.

Figure 12:
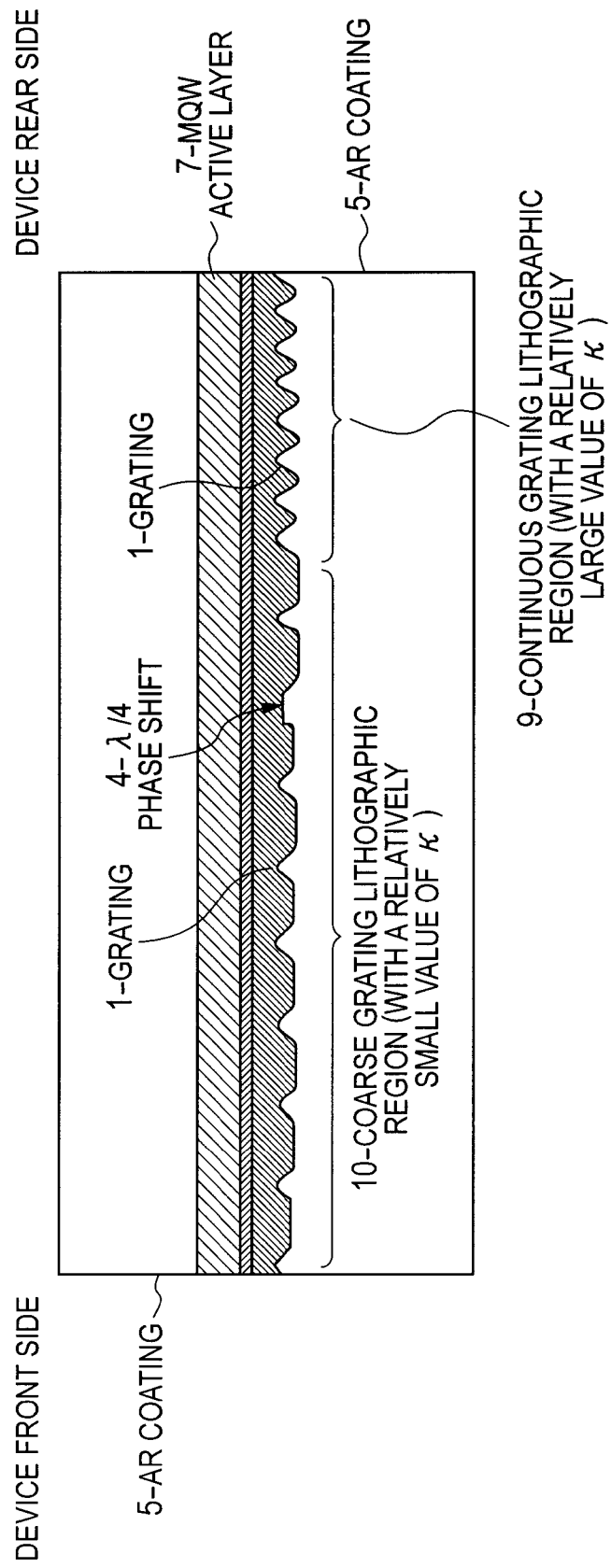
FIG. 12 is an explanatory diagram concerning the related art.

A configurational example of an extremely short grating lithographic part is shown in FIG. 12 for the purpose of reference. In this example shown in FIG. 12, a grating lithographic part and a space part are patterned alternately in a coarse grating lithographic region 10. Due to optical wave scattering in grating diffraction, a high-order mode of ±90° is brought about in the configuration shown in FIG. 12. This causes an optical loss in optical waveguiding, signifying that the configuration of FIG. 12 is not applicable as a DFB-LD structure. Note that the configuration of FIG. 12 is disclosed in the Patent Document 8 as an arrangement for outputting an optical beam in a direction not parallel to the optical waveguide axial direction.

Figure 10:
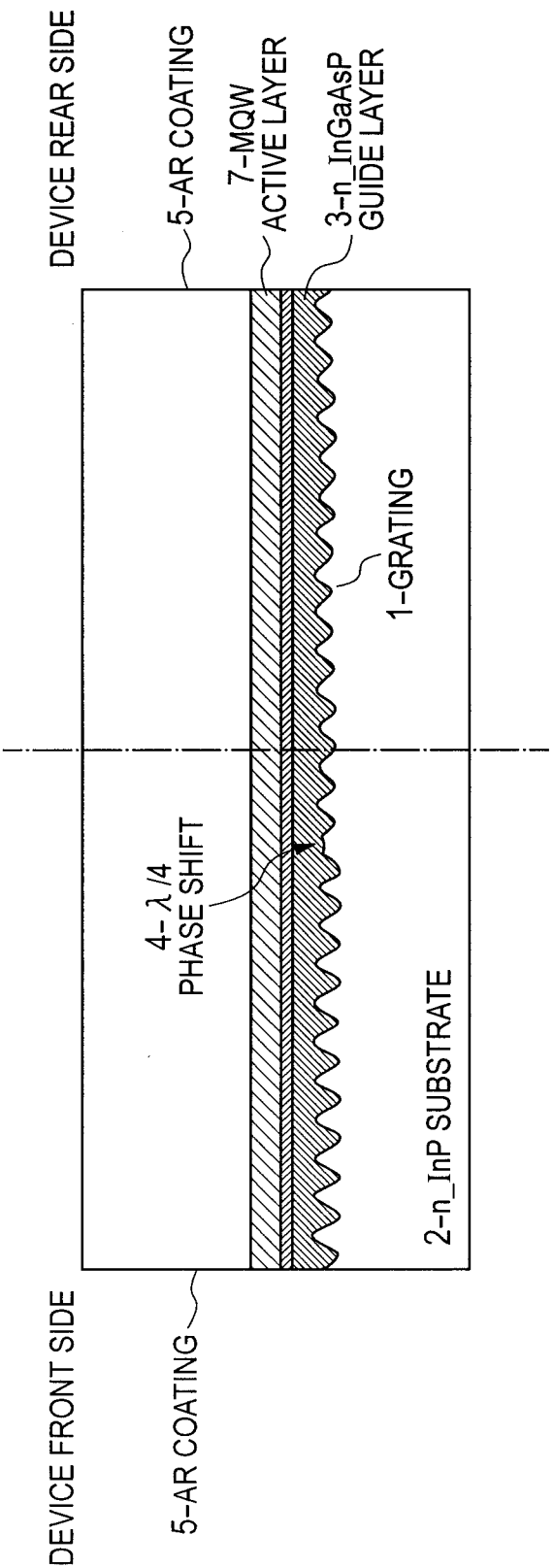
FIG. 10 is a diagram showing an exemplary configuration of a typical conventional AR/AR DFB-LD device (schematically illustrating a longitudinal cross-section parallel to the optical waveguide axial direction of the AR/AR DFB-LD device)
Figure 11:
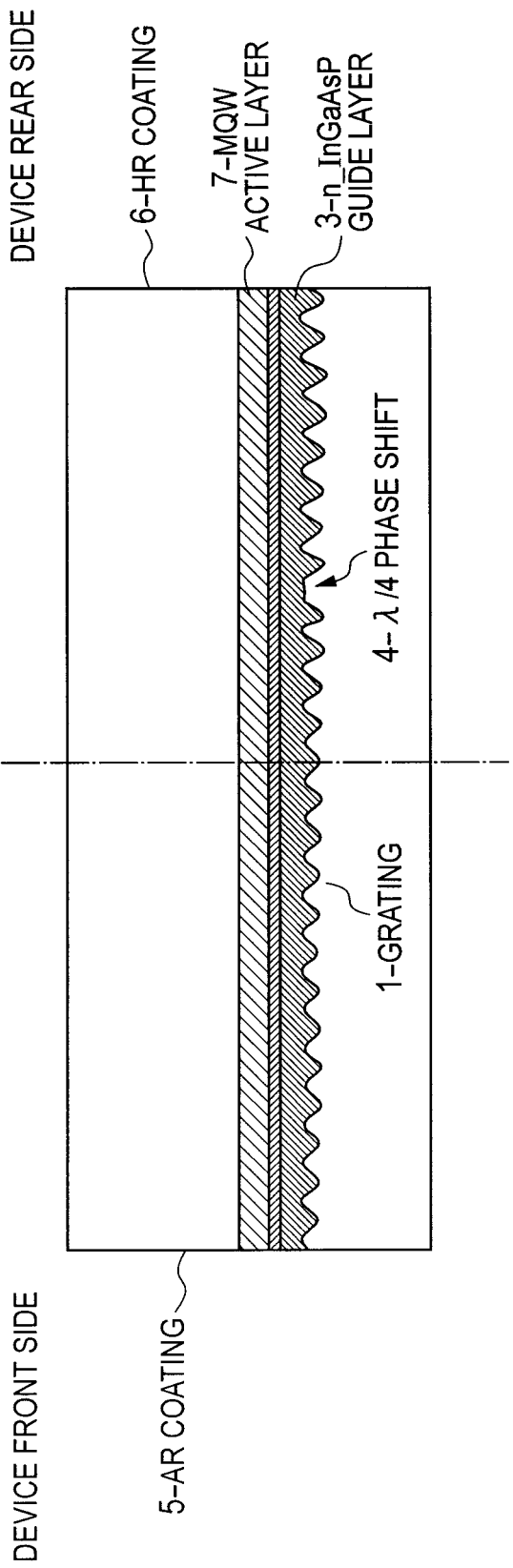
FIG. 11 is a diagram showing an exemplary configuration of a typical conventional AR/HR DFB-LD device (schematically illustrating a longitudinal cross-section parallel to the optical waveguide axial direction of the AR/HR DFB-LD device)

Contrastingly, an entirely continuous grating pattern is formed in each of conventional DFB-LD devices shown in FIGS. 10 and 11. In this case, scattered waves in grating diffraction are produced only in the optical waveguide axial direction.

According to the first preferred embodiment of the present invention, the grating lithographic part having a finite length and the space part 8 are alternately repeated. This configuration can be regarded as an intermediate type of arrangement based on the configuration shown in FIG. 12 and the entirely continuous grating pattern.

Part of scattered waves in grating diffraction radiate in other than the optical waveguide axial direction, causing an optical radiation loss. However, under a condition where a grating lithographic part is formed to have a length of at least five grating periods, the degree of optical radiation loss can be limited within a substantially allowable range.

In the Patent Document 7, there is disclosed an exemplary configuration wherein a grating lithographic part having a length of two periods and a space part having a length corresponding to one period are alternately repeated. In this case, there is a possibility that an adverse effect may be caused by an optical loss in optical waveguiding.

Hence, in the first preferred embodiment of the present invention, the grating lithographic part should have a length of at least five grating periods.

Figure 2:
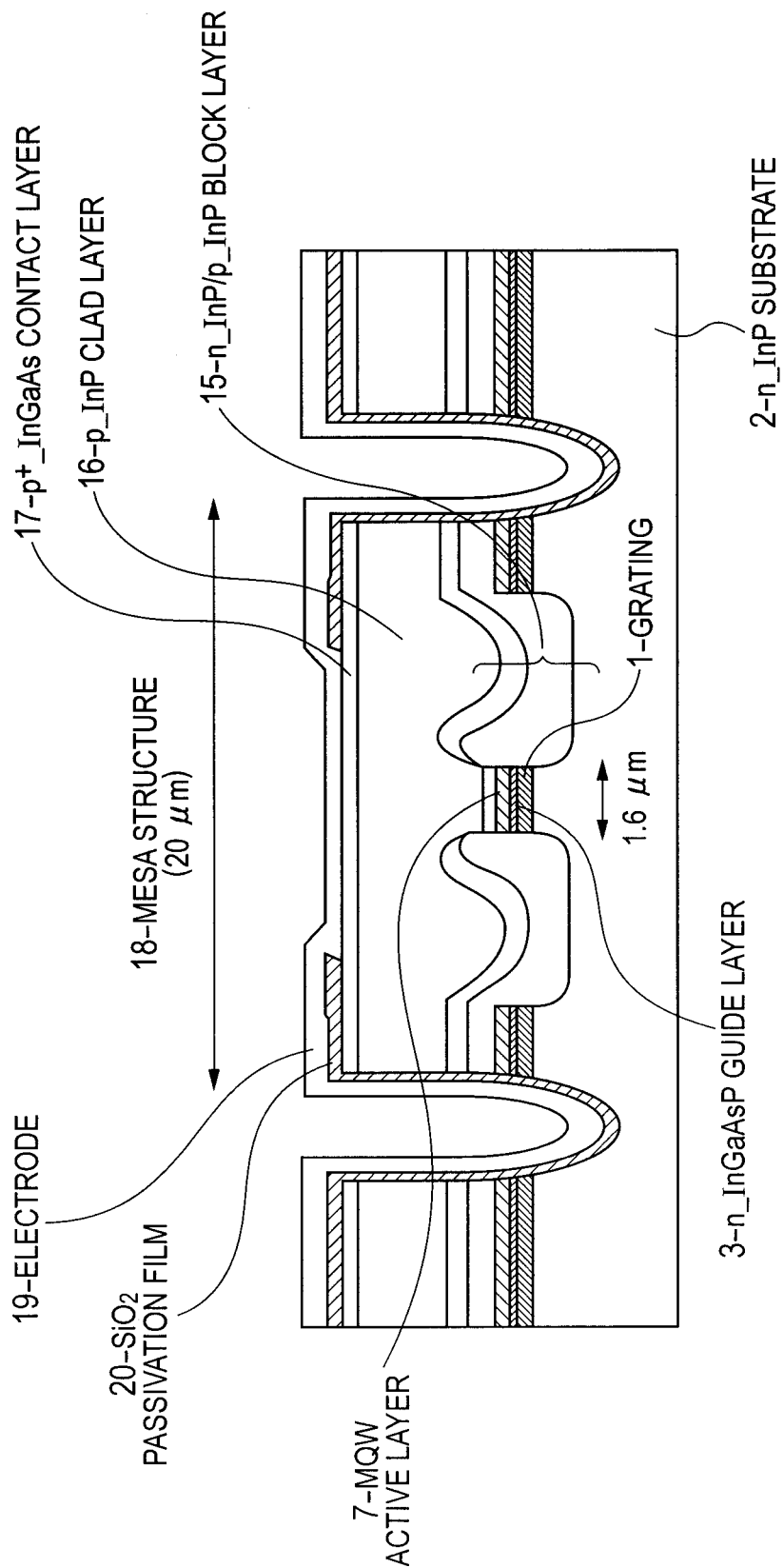
FIG. 2 is an explanatory diagram showing the configuration of the DFB-LD device according to the first preferred embodiment of the present invention (schematically illustrating a transverse cross-section perpendicular to the optical waveguide axial direction of the DFB-LD device)
Figure 3:
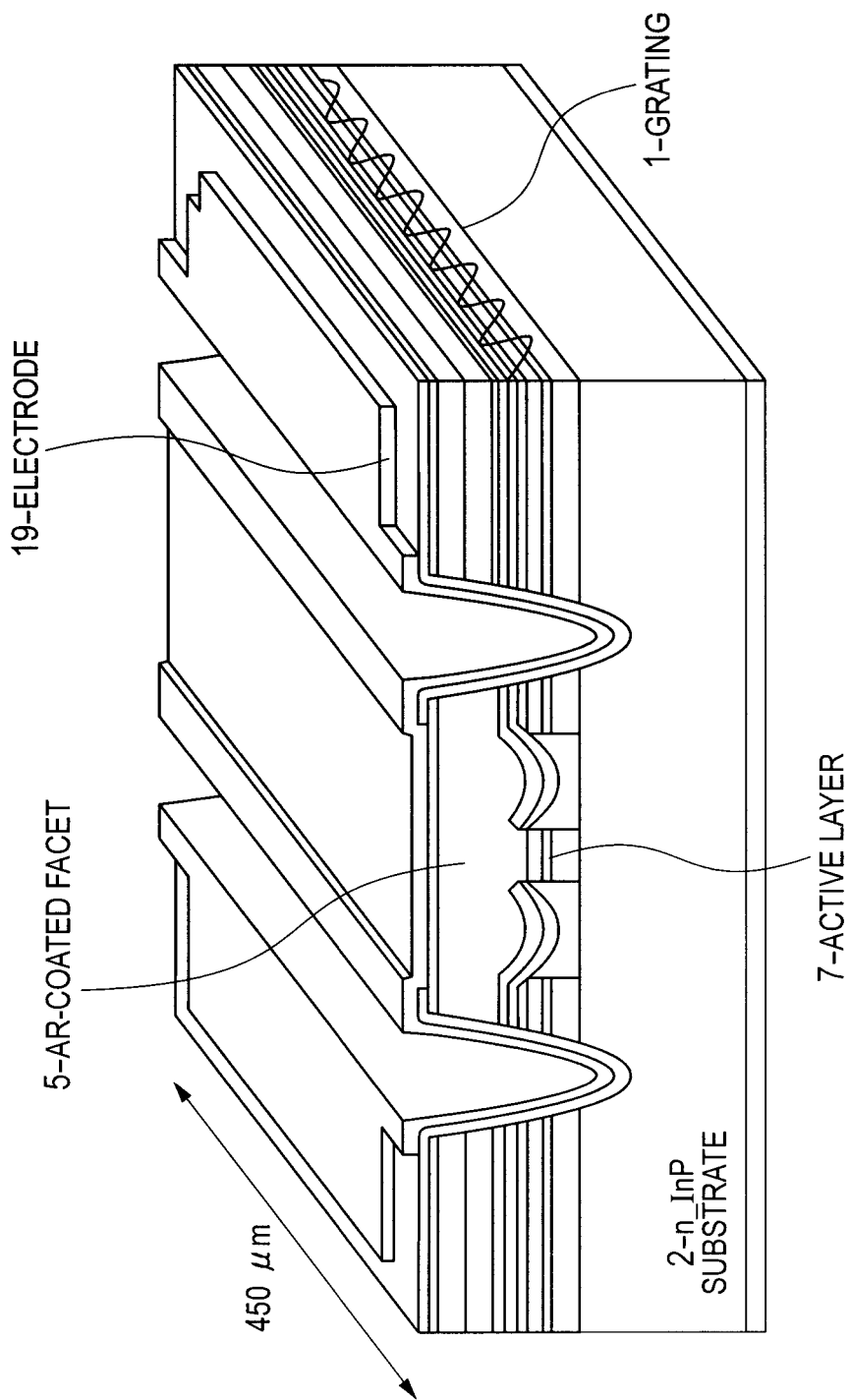
FIG. 3 is a perspective view showing the overall arrangement of the DFB-LD device according to the first preferred embodiment of the present invention.

FIGS. 1, 2, and 3 are diagrams showing the configuration of the DFB-LD device according to the first preferred embodiment of the present invention. FIG. 1 is a schematic illustration of a longitudinal cross-section parallel to the optical waveguide axial direction of the DFB-LD device, with electrodes thereof not shown. FIG. 2 is a schematic illustration of a transverse cross-section perpendicular to the optical waveguide axial direction of the DFB-LD device. FIG. 3 is a perspective view of the overall arrangement of the DFB-LD device. FIG. 1 corresponds to a side view of a sectional structure shown in FIG. 3, and FIG. 2 corresponds to a front view of a sectional structure shown in FIG. 3. The DFB-LD device according to the first preferred embodiment of the present invention is formed to have a buried heterostructure, wherein the device length "L" is 450 µm, and the width of an active layer 7 is 1.6 µm, though not particularly limited thereto. It is to be understood that specific dimensional values indicated in FIGS. 1 to 3 are for illustrative purposes only, and are not intended to limit the scope of the present invention.

Over an InP substrate 2, there is formed a grating 1, which is buried with an InGaAsP guide layer 3. Then, over the InGaAsP guide layer 3, there is formed an active layer 7 having an MQW structure (multiple quantum wells; five quantum well layers). The MQW structure of the active layer 7 is designed to provide an oscillation wavelength of 1.55 µm. In the vicinity of the center of the optical waveguide, a λ/4 phase shift part 4 is disposed.

As shown in FIG. 1, the present invention is applied to the formation of gratings 1. In a ⅔ region from the device front end across the λ/4 phase shift part 4 (300 µm in length), coarse lithographic patterning is made in grating formation (coarse grating lithographic region 10). In each grating 1, a period of λ/2 is provided, and an alternately repetitive pattern of a grating 1 having ten periods and a no-grating space part (space part 8) is formed. The space part 8 (referred to just as "space" wherever appropriate) has an optical waveguide length corresponding to ten grating periods.

Note that, in the condition "the space part 8 has an optical waveguide length corresponding to ten grating periods", a factor of correction is included as described above for a difference in refractive index with respect to optical waveguiding through a corresponding grating lithographic part.

In a ⅓ region on the device rear side (150 µm in length), continuous grating lithographic patterning is arranged to provide grating formation without partial missing of grating lines (continuous grating lithographic region 9).

The grating depth is constant on the device front region (coarse grating lithographic region 10) and the device rear region (continuous grating lithographic region). Thus, the average value of optical coupling coefficient κ in the device front region is ½ the value of optical coupling coefficient κ in the device rear region.

More specifically, the constant depth of grating is determined so that the device front region has a value of "optical coupling coefficient κ=35 cm$^{-1}$" on average and the device rear region has a value of "optical coupling coefficient κ=70 cm$^{-1}$".

As shown in FIG. 1, AR coating 5 (anti-reflection coating) is made on both the front and rear facets of the device (AR/AR DFB-LD device).

In a conventional AR/AR DFB-LD device such as shown in FIG. 10, it is a common feature that a λ/4 phase shift part 4 is disposed at a position that is slightly anterior to the center point of the optical waveguide for the purpose of enhancement in forward optical output.

Contrastingly, in the first preferred embodiment of the present invention, since the degree of reflection of waveguided light per unit length of grating in the device rear region is larger than that in the device front region, the λ/4 phase shift part 4 is disposed at a position that is slightly posterior to the center point of the optical waveguide, though the AR/AR structure is adopted.

Based on estimation of the optical output characteristic of the AR/AR DFB-LD device according to the first preferred embodiment of the present invention, the forward/backward optical output ratio (=ratio of forward optical power to backward optical power) can be specified to have a value of at least 2.

That is, it has been confirmed that the AR/AR DFB-LD device according to the first preferred embodiment of the present invention provides a higher level of efficiency in forward optical output than that of the conventional AR/AR DFB-LD device, in spite of an optical radiation loss due to the provision of the finite-length grating lithographic parts. Further, in the first preferred embodiment of the present invention, there has been confirmed a satisfactory level of single-mode oscillation stability which is almost equivalent to that of the conventional AR/AR DFB-LD device having a uniform value of optical coupling coefficient κ.

The level of single-mode oscillation stability is determined by using SMSR (side mode suppression ratio) as an index, and a condition range of "SMSR>approximately 40 dB" is required in common applications. According to the first preferred embodiment of the present invention, the yield level regarding the SMSR is almost equivalent to that of the conventional AR/AR DFB-LD device having a uniform value of optical coupling coefficient κ.

Figure 4:
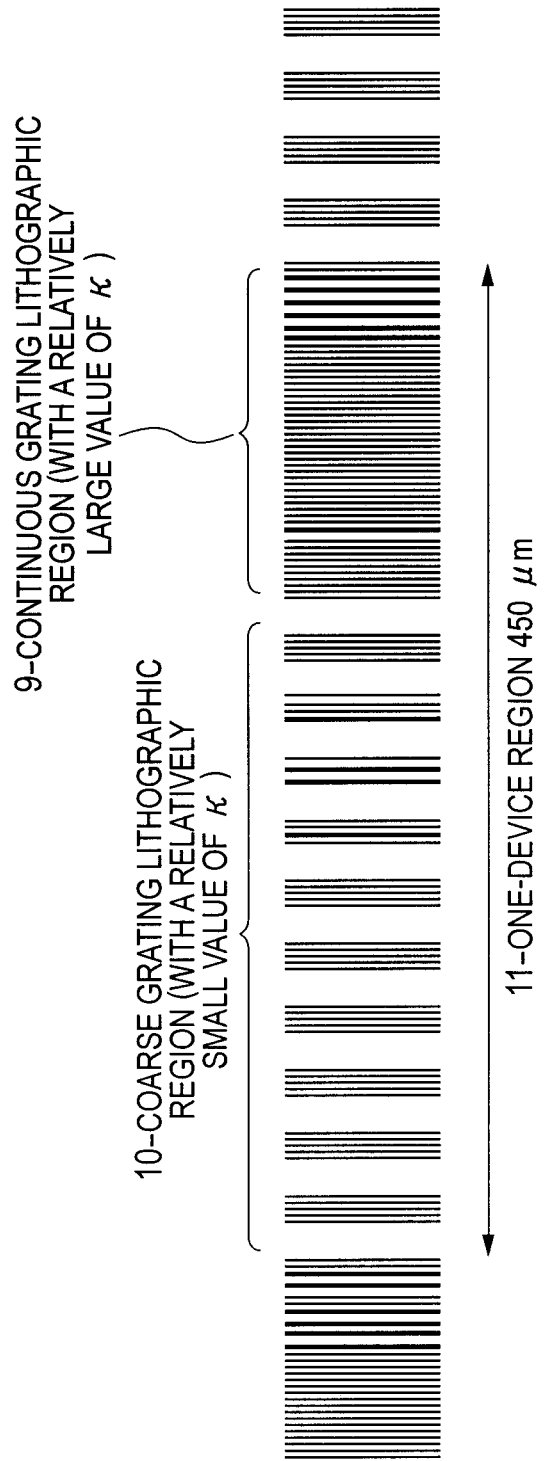
FIG. 4 is a plan view showing an electron beam (EB) lithographic pattern in a fabrication process according to the first preferred embodiment of the present invention.

In the first preferred embodiment of the present invention, a photoresist pattern for grating formation is drawn by EB lithography. In practice, through adjustment of the EB lithography program, a grating pattern is drawn only at a specified position. Thus, the grating concerned can be formed only at the specified position. FIG. 4 shows a schematic diagram of an EB lithographic pattern for grating formation in a fabrication process according to the first preferred embodiment of the present invention (a plan view taken from the top side of the substrate).

Except EB lithography for grating formation by using a photoresist pattern, a fabrication method similar to that for conventional DFB-LD devices is employed in the first preferred embodiment of the present invention. The following describes the fabrication method according to the first preferred embodiment of the present invention. Referring to FIGS. 5A to 5D, there are shown cross-sectional views of processes in the flow of fabrication for the purpose of explaining the fabrication method according to the first preferred embodiment of the present invention.

1) A pattern of a grating 1 is burnt into a photoresist film over an n_InP substrate 2 by EB lithography. Then, the grating 1 is formed by wet etching. For this step, EB lithography programming is performed so that the grating 1 is patterned to have a configuration such as shown in FIG. 4.

Figure 5A:
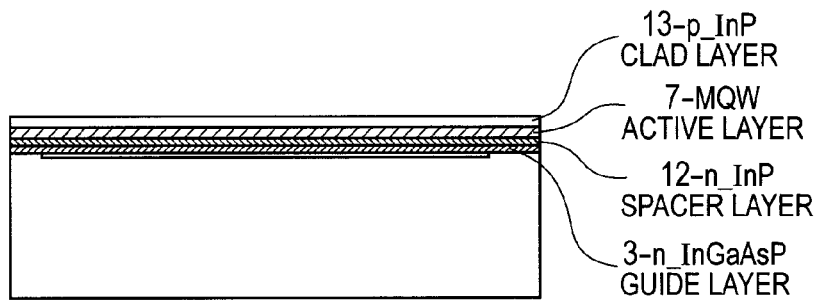

2) Crystal growth processing is made to provide an n_InGaAsP guide layer 3, an n_InP spacer layer 12, an MQW active layer 7 (having an MQW structure of five quantum well layers for a wavelength band of 1.55 μm), and a p_InP clad layer 13 (FIG. 5A).

Figure 5B:
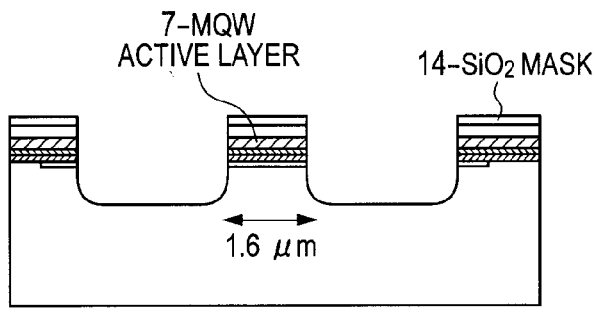

3) By dry etching with a $SiO_2$ mask 14, the MQW active layer 7 is shaped to have a width of 1.6 μm (FIG. 5B).

Figure 5C:
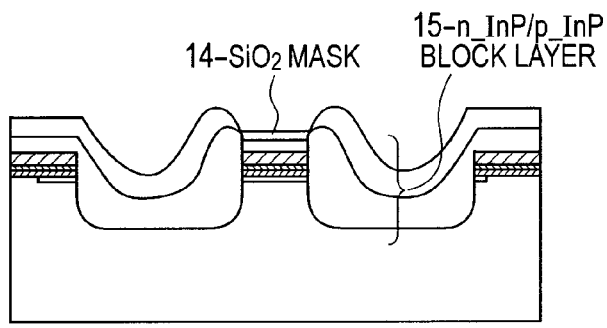

4) With the $SiO_2$ mask 14 left only over the MQW active layer 7, crystal growth processing is made to provide an n_InP/p_InP block layer 15 (FIG. 5C).

Figure 5D:
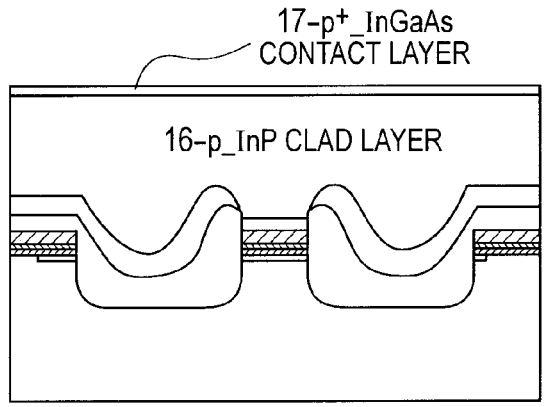

5) After removal of the $SiO_2$ mask 14, crystal growth processing is made to provide a p_InP clad layer 16 and a p+_InGaAs contact layer 17 (FIG. 5D).

6) A mesa structure 18 having a width of 20 μm is formed to provide an electrode 19 (FIG. 2).

Second Preferred Embodiment

Figure 6:
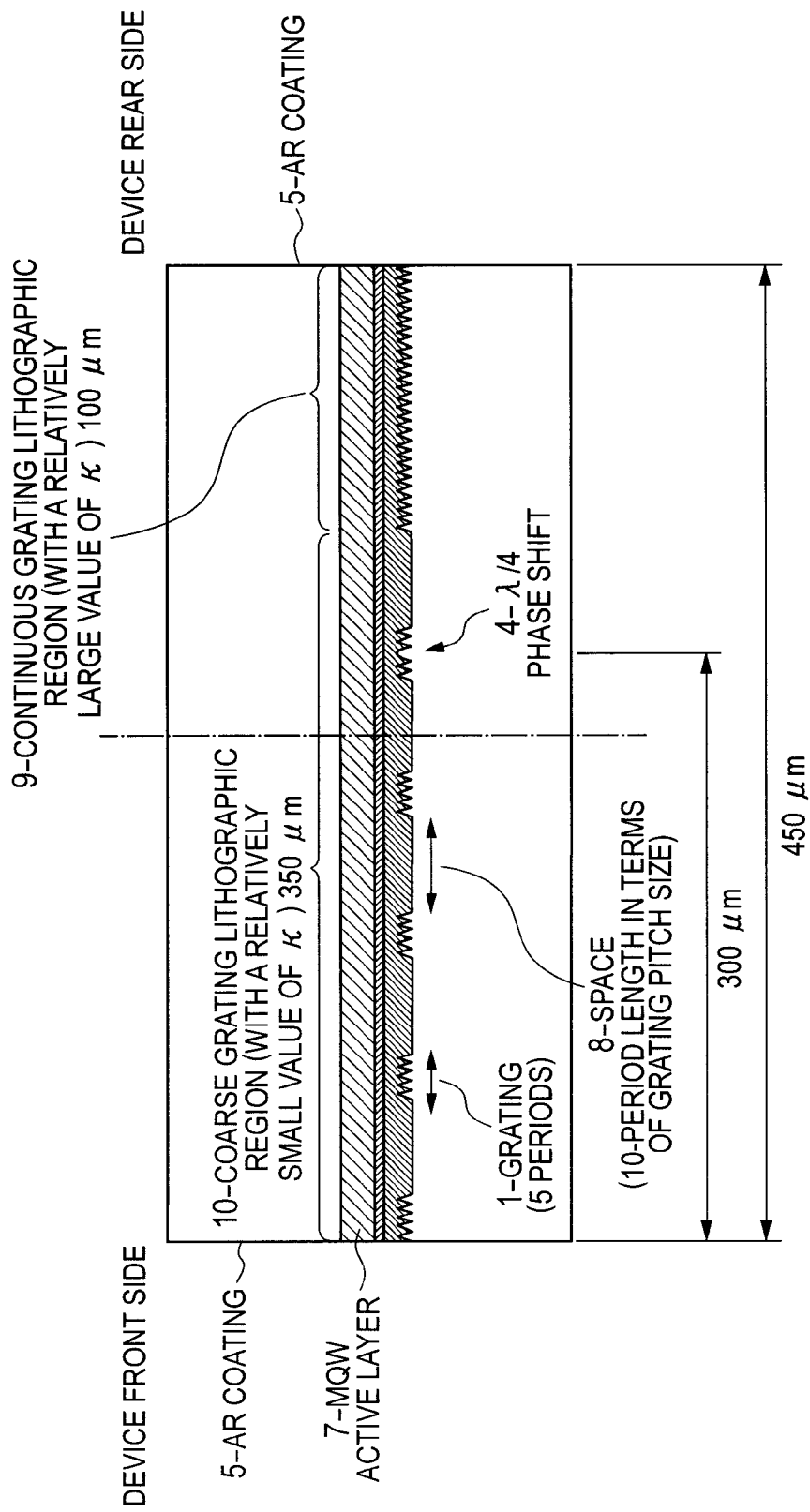
FIG. 6 is an explanatory diagram showing a configuration of a DFB-LD device according to a second preferred embodiment of the present invention (schematically illustrating a longitudinal cross-section parallel to the optical waveguide axial direction of the DFB-LD device)

Then, the following describes a second preferred embodiment of the present invention. Referring to FIG. 6, there is shown a configuration of a DFB-LD device according to the second preferred embodiment of the present invention. In FIG. 6, a longitudinal cross-section parallel to the optical waveguide axial direction of the DFB-LD device is illustrated schematically. According to the second preferred embodiment of the present invention, the device length L is 450 μm as in the case of the first preferred embodiment mentioned above, and a λ/4 phase shift part 4 is disposed at a position of 300 λm from the device front end.

In the second preferred embodiment of the present invention, a coarse grating lithographic region 10 is provided in a length of 350 λm across the λ/4 phase shift part 4 on the device front side. Further, in the coarse grating lithographic region 10 in the second preferred embodiment, there is formed an alternately repetitive pattern of a grating 1 having five periods and a no-grating space part 8 (having a length of ten-period space). Note that, in the length of the space part 8, a factor of correction is included for a difference in refractive index with respect to optical waveguiding as set forth in the description of the first preferred embodiment.

In a ⅓ region on the device rear side (100 μm in length), continuous grating lithographic patterning is arranged to provide grating formation without partial missing of grating lines (continuous grating lithographic region 9). In comparison with the first preferred embodiment wherein the density of grating lithographic patterning in the device front region is ½ that in the device rear region (⅓ region), the second preferred embodiment provides a grating arrangement wherein the density of grating lithographic patterning in the device front region is ⅓ that in the device rear region (⅓ region).

More specifically, in the second preferred embodiment, while the device rear region (⅓ region), i.e., the continuous grating lithographic region 9 has a value of "1" in terms of grating lithographic density, the coarse grating lithographic region 10 has a value of "⅓ (=5/(5+10))" in terms of grating lithographic density since a pattern of "(5 periods of grating)+ (10 periods of space)" is repeated. Thus, the difference in density of grating lithographic patterning between the device front region and the device rear region is represented as "1/ (⅓)=3 times".

The depth of grating is determined so that the device front region has an optical coupling coefficient value κ of 27 $cm^{-1}$ on average and the device rear region has an optical coupling coefficient value κ of 81 $cm^{-1}$. The transverse cross-section perpendicular to the optical waveguide axial direction of the DFB-LD device and the active layer configuration thereof in the second preferred embodiment are similar to those in the first preferred embodiment. In the second preferred embodiment, AR coating 5 (anti-reflection coating) is made on both the front and rear facets similarly to the first preferred embodiment.

Based on estimation of the optical output characteristic of the AR/AR DFB-LD device according to the second preferred embodiment, the forward/backward optical output ratio can be specified to have a value of at least 3. That is, it has been confirmed that the AR/AR DFB-LD device according to the second preferred embodiment provides forward optical output efficiently, in spite of an optical radiation loss due to the provision of the finite-length grating lithographic parts. Further, it has been ascertained that the yield level regarding the SMSR in the second preferred embodiment is almost equivalent to that of the conventional AR/AR DFB-LD device having a uniform value of optical coupling coefficient κ.

Third Preferred Embodiment

Then, the following describes a third preferred embodiment of the present invention. Referring to FIG. 7, there is shown a configuration of a DFB-LD device according to the third preferred embodiment of the present invention. In FIG. 7, a longitudinal cross-section parallel to the optical waveguide axial direction of the DFB-LD device is illustrated schematically. In the third preferred embodiment, as shown in FIG. 7, a λ/4 phase shift part is not employed, differently from the case of the first preferred embodiment illustrated in FIG. 1. The other configurational features of the third preferred embodiment are the same as those of the first preferred embodiment in FIG. 1.

In the third preferred embodiment, a coarse grating lithographic region 10 is provided with an alternately repetitive pattern of a grating 1 having ten periods and a no-grating space part 8 (having a length of ten-period space). Note that, in the length of the space part 8, a factor of correction is included for a difference in refractive index with respect to optical waveguiding as described above.

At the device center position included in the coarse grating lithographic region 10 in the third preferred embodiment, there is disposed a space part 21 having a length of 5.5-period space (with an increase of 0.5 period; a space having an optical path length corresponding to half an integral multiple of a grating period). This arrangement is equivalent to a case where there is disposed a space part having a length of ¼ times a wavelength λ. The space part 21 having an optical path length corresponding to half an integral multiple of a grating period is used in place of a λ/4 phase shift part. In the third preferred embodiment, the depth of grating and other configurational grating conditions are the same as those described with respect to the first preferred embodiment.

In the third preferred embodiment, it is also possible to obtain DFB-LD emission characteristics equivalent to those of the first preferred embodiment. Note that, since there is disposed just one space 21 having an optical path length corresponding to half an integral multiple of a grating period, it is insignificant to specify the inclusion/exclusion of a negligible correction factor value for a difference in refractive index with respect to optical waveguiding in the case of the length of the space 21 (a factor of correction may or may not be included in the length of space 21).

Fourth Preferred Embodiment

Figure 8:
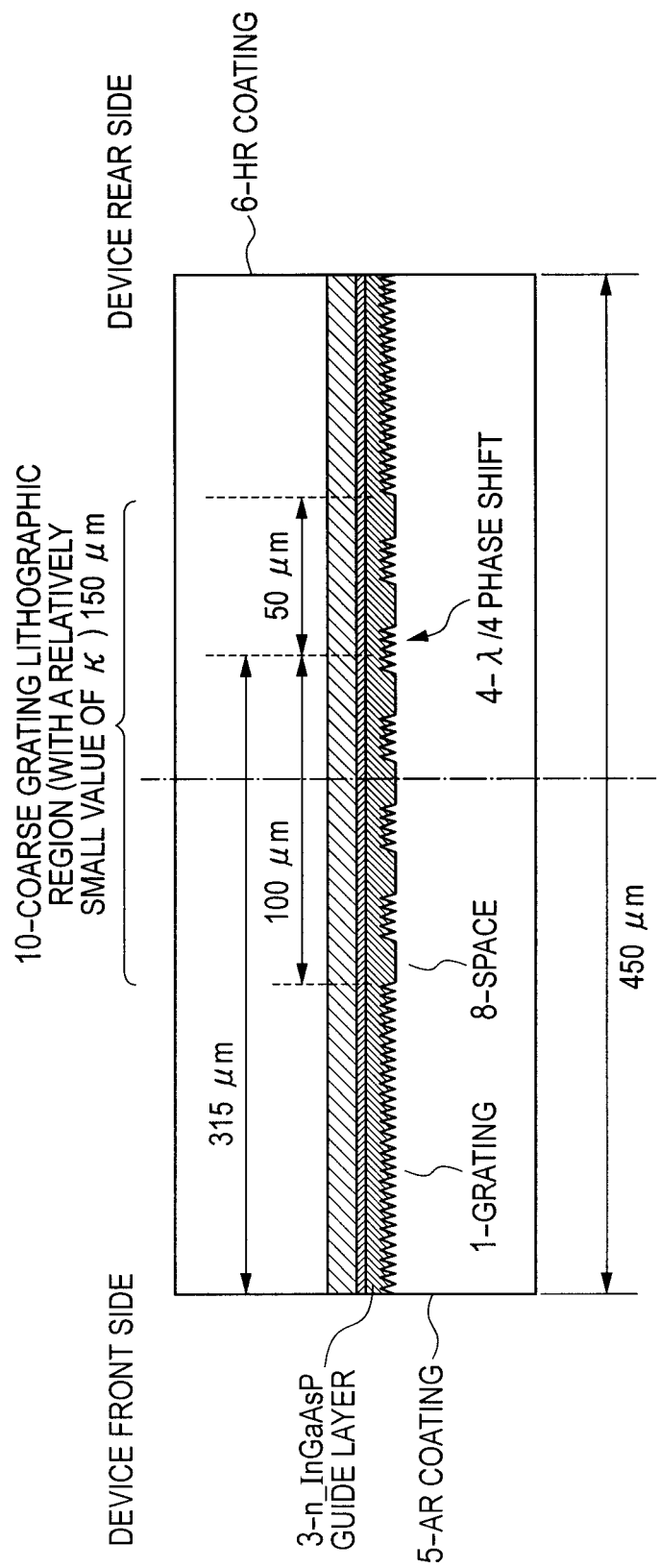
FIG. 8 is an explanatory diagram showing a configuration of a DFB-LD device according to a fourth preferred embodiment of the present invention (schematically illustrating a longitudinal cross-section parallel to the optical waveguide axial direction of the DFB-LD device)

Then, the following describes a fourth preferred embodiment of the present invention. Referring to FIG. 8, there is shown a configuration of a DFB-LD device according to the fourth preferred embodiment of the present invention. In FIG. 8, a longitudinal cross-section parallel to the optical waveguide axial direction of the DFB-LD device is illustrated schematically. The transverse cross-sectional configuration, the active layer configuration, and the device length in the fourth preferred embodiment are the same as those in the first to third preferred embodiments described above.

In the fourth preferred embodiment, an AR/HR DFB-LD structure is employed in which HR coating (high-reflection coating; 75% reflectivity) is made on the rear facet while AR coating is made on the front facet, and a $\lambda/4$ phase shift part 4 is disposed at a position of 315 μm from the device front end. The AR/HR DFB-LD structure employed in the fourth preferred embodiment is advantageous in the efficiency of forward optical output, i.e., the forward/backward optical output ratio can be specified to have a value of at least 4.

According to the fourth preferred embodiment, a coarse grating lithographic region 10 having a length of 150 μm is provided in the vicinity of the $\lambda/4$ phase shift part 4. More specifically, the coarse grating lithographic region 10 is formed in a range including a device front side of 100 μm in length from the $\lambda/4$ phase shift part 4 regarded as an intermediate point and a device rear side of 50 μm in length therefrom. A continuous grating lithographic region is provided in each of a range of 215 μm in length from the device front end and a range of 85 μm in length from the device rear end.

Generally, at the time of laser oscillation in a DFB-LD device, the level of optical density becomes higher in the vicinity of a $\lambda/4$ phase shift part, which is one of the causes of occurrence of wavelength chirping in modulation drive. The phenomenon "wavelength chirping" is an undesirable condition of wavelength variations on the order of $\Delta v$ to several GHz, which brings about an adverse effect on optical signal communication such as a decrease in transmission limit distance.

In the fourth preferred embodiment, a value of optical coupling coefficient $\kappa$ is decreased in the vicinity of the $\lambda/4$ phase shift part 4, thereby alleviating the concentration of optical density in the vicinity of the $\lambda/4$ phase shift part 4.

Figure 9:
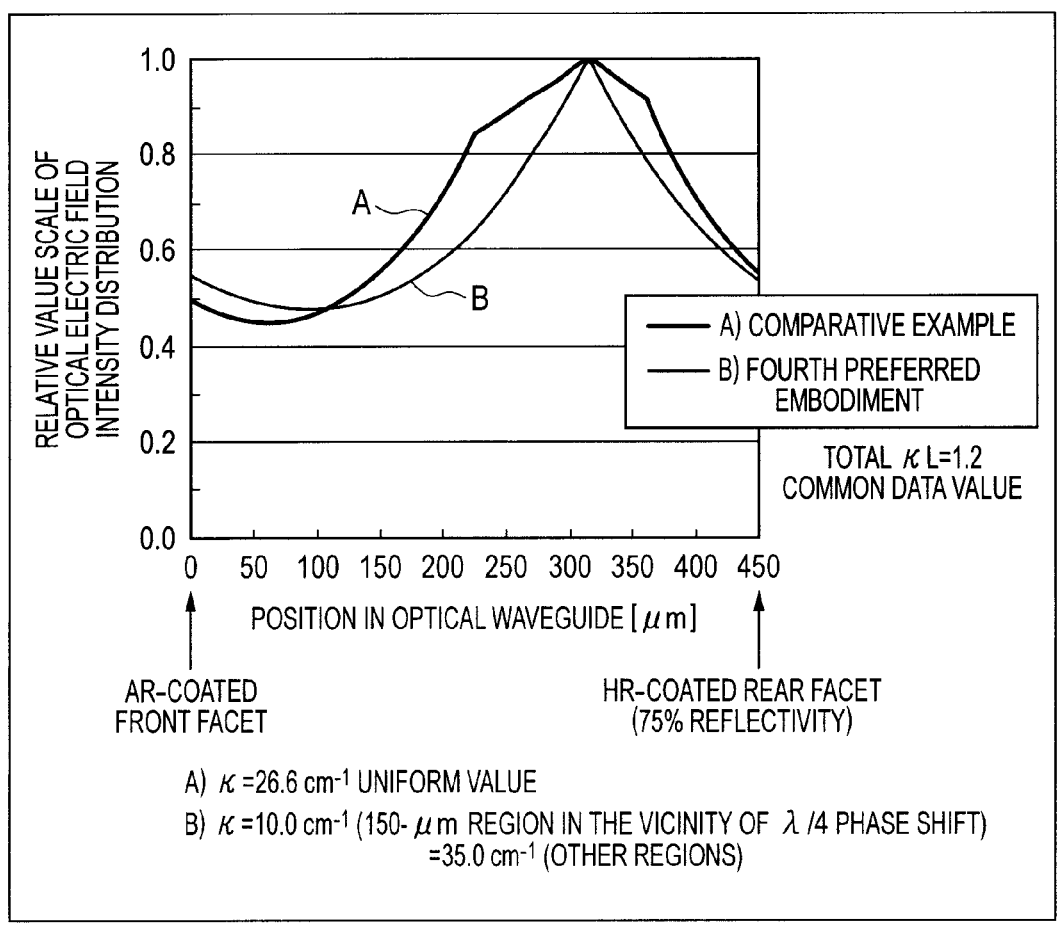
FIG. 9 is a diagram showing the results of simulations of optical electric field intensity distribution in optical waveguides in comparison between the AR/HR DFB-LD devices of the fourth preferred embodiment of the present invention and a conventional comparative example.

Referring to FIG. 9, there is shown a diagram indicating the results of estimations (simulations) of optical electric field intensity distribution in optical waveguides of AR/HR DFB-LD devices. In FIG. 9, line A indicates simulation result data of a comparative example, and line B indicates simulation result data of the fourth preferred embodiment. The horizontal axis represents positions in each optical waveguide (the leftmost position of the horizontal axis corresponds to the AR-coated front facet of each device, and the rightmost position of the horizontal axis corresponds to the HR-coated rear facet thereof (75% reflectivity). The vertical axis represents relative values of optical electric field intensity distribution.

The comparative example indicated by line A corresponds to the conventional AR/HR DFB-LD device shown in FIG. 11, which has a uniform value of "optical coupling coefficient $\kappa=26.6$ cm$^{-1}$". In the fourth preferred embodiment indicated by line B, the coarse grating lithographic region having a length of 150 μm region in the vicinity of the $\lambda/4$ phase shift part 4 provides a value of "optical coupling coefficient $\kappa=10.0$ cm$^{-1}$", and the other regions provide a value of "optical coupling coefficient $\kappa K=35.0$ cm$^{-1}$". Note that $\kappa \times L=1.2$.

In the first to fourth preferred embodiments described above, each space part 8 has an optical path length corresponding to a multiple ($\times 1$, $\times 2$) of a grating periodic length of an alternately patterned grating lithographic part. It is to be understood that, in the present invention, the optical path length of the space part 8 is not limited to a multiple of a grating periodic length of a grating lithographic part, and the optical path length of the space 8 is merely required to be an integral multiple of a grating period (half an integral multiple of a wavelength $\lambda$). Further, space parts having different lengths may be provided mixedly only if each of the space parts has an optical path length of an integral multiple of a grating period. Note, however, that a factor of correction for a difference in refractive index with respect to optical waveguiding through a corresponding grating lithographic part should be included so that the optical path length of each space part is accurately half an integral multiple of a wavelength $\lambda$.

According to the present invention, it is possible to realize a DFB-LD device capable of satisfactorily providing different optical coupling coefficient values $\kappa$ in different optical waveguide regions as required. This feature can be implemented without resort to such conditioning as grating depth adjustment or guide layer composition modulation.

Further, since grating formation is made on the premise that a grating photoresist pattern is drawn by EB lithography, the present invention can be carried out just by adjusting the EB lithography program concerned in practical application to device fabrication. Hence, the present invention can be practiced in fabrication processes equivalent to those for conventional DFB-LD devices. A DFB-LD device according to the present invention has operational advantages such as mentioned below.

In AR/AR DFB-LD design, the forward/backward optical output ratio can be enhanced while ensuring satisfactory stability of single-mode oscillation that is characteristic thereof.

The concentration of optical density in the vicinity of the $\lambda/4$ phase shift part can be alleviated in laser oscillation to suppress wavelength chirping.

The present invention is well suitable for application to the provision of a semiconductor laser device that is used as a light source in optical fiber communication. In particular, the present invention is applicable to the provision of a light source for optical fiber communication wherein signal transmission over a distance longer than 25 km and modulation drive at a rate exceeding 1 Gbps are required.

As a light source for optical fiber communication, a DFB-LD device is used in most cases. For this application, it is of particular importance to carry out high-yield fabrication of DFB-LD devices having stable single-mode wavelength oscillation and high efficiency of optical output. Further, it is desired to fabricate DFB-LD devices having an advantageous communication characteristic that suppresses wavelength variations in laser oscillation. The present invention has practical applicability for meeting these requirements regarding optical fiber communication.

The disclosures contained in the patent documents cited in the foregoing are incorporated herein by reference in their entirety. It is to be understood that various modifications and adjustments may be made in the above-described embodiments and examples of the present invention, within the scope of the entire disclosure of the present invention including the appended claims, based on the fundamental technical idea thereof. Further, it is also to be appreciated that various combinations and selections of the elements disclosed herein may be made within the scope of the appended claims of the present invention. That is, it is apparent that the present invention may embrace various changes and modifications to be made by those skilled in the art in accordance with the disclosure of the present invention including the appended claims and the fundamental technical idea thereof.

What is claimed is:

1. A distributed feedback semiconductor laser diode device including a diffraction grating formed in an optical waveguide thereof, the optical waveguide comprising:
   a plurality of grating parts each possessing a distributive refractivity characteristic; and
   a plurality of no-grating space parts each possessing a uniform refractivity characteristic;
   wherein an alternately repetitive pattern of the grating parts each possessing a distributive refractivity characteristic and the no-grating space parts each possessing a uniform refractivity characteristic is formed to provide a coarse grating lithographic region,
   wherein the grating parts each possessing a distributive refractivity characteristic each includes at least a predetermined number of grating periods, and
   wherein the no-grating space parts each possessing a uniform refractivity characteristic each has an optical path length that is half an integral multiple of a wavelength of laser oscillation,
   wherein, in the optical waveguide, the coarse grating lithographic region is extended from the device front end position across the phase shift part located in the vicinity of the center of the optical waveguide, and a continuous grating lithographic region without partial missing of grating lines is extended from the end position of the coarse grating lithographic region to the device rear end position.

2. The distributed feedback semiconductor laser diode device according to claim 1,
   wherein the grating parts each possessing a distributive refractivity characteristic each includes at least five grating periods.

3. The distributed feedback semiconductor laser diode device according to claim 1,
   wherein a phase shift part is disposed at a predetermined position in a region where the grating parts are formal in the optical waveguide.

4. The distributed feedback semiconductor laser diode device according to claim 1,
   wherein one of the no-grating space parts possessing a uniform refractivity characteristic has an optical path length corresponding to half an integral multiple of a grating period of the grating part.

5. The distributed feedback semiconductor laser diode device according to claim 1,
   wherein the coarse grating lithographic region is provided on the device front side in the optical waveguide.

6. The distributed feedback semiconductor laser diode device according to claim 3,
   wherein the coarse grating lithographic region is provided in the vicinity of the phase shift part in the optical waveguide.

7. The distributed feedback semiconductor laser diode device according to claim 1,
   wherein a phase shift part is disposed in the coarse grating lithographic region in the optical waveguide, and
   wherein the continuous grating lithographic region without partial missing of grating lines is provided on each of the device front side and the device rear side in the optical waveguide.

8. The distributed feedback semiconductor laser diode device according to claim 3,
   wherein, instead of the phase shift part, there is provided a region that possesses a uniform refractivity characteristic and has an optical path length corresponding to half an integral multiple of a grating period of the grating part.

9. The distributed feedback semiconductor laser diode device according to claim 1,
   wherein the no-grating space part possessing a uniform refractivity characteristic has an optical path length represented as "an integral multiple of a grating periodic length of the grating part multiplied by a correction value of refractive index".

* * * * *